US 11,985,794 B2

United States Patent
Cho et al.

(10) Patent No.: US 11,985,794 B2
(45) Date of Patent: May 14, 2024

(54) THERMAL OPTIMIZED CONTROL IN RESPONSE TO AIR MOVER FAILURE

(71) Applicant: Dell Products L.P., Round Rock, TX (US)

(72) Inventors: Shih-Huai Cho, New Taipei (TW); Hsiang-Jung Chin, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 153 days.

(21) Appl. No.: 17/857,305

(22) Filed: Jul. 5, 2022

(65) Prior Publication Data
US 2024/0015925 A1    Jan. 11, 2024

(51) Int. Cl.
*H05K 7/20*    (2006.01)

(52) U.S. Cl.
CPC .................. *H05K 7/20209* (2013.01)

(58) Field of Classification Search
CPC ..... H05K 7/20; H05K 7/20136–20145; H05K 7/20154; H05K 7/20172; H05K 7/2019; H05K 7/20209; H05K 7/20445; H05K 7/20718; H05K 7/20736; H05K 5/00; H05K 5/02; H05K 5/0213; H01L 23/34; H01L 23/367; H01L 23/3675; H01L 23/46–467; F04D 25/08; F04D 25/12; F04D 29/4226; F04D 29/626; F04D 29/646; F24F 7/007; F24F 11/00; F24F 11/30; G06F 1/20; G06F 1/206; G06F 1/28; G06F 9/542; G06F 2200/201; G05B 17/02

See application file for complete search history.

(56) References Cited

U.S. PATENT DOCUMENTS

| | | | |
|---|---|---|---|
| 5,949,646 A * | 9/1999 | Lee | H05K 7/2019 165/104.34 |
| 10,146,190 B2 | 12/2018 | Lovicott et al. | |
| 11,350,543 B2 | 5/2022 | Shabbir | |
| 2016/0183406 A1* | 6/2016 | Ragupathi | H05K 7/20836 700/282 |
| 2018/0164841 A1* | 6/2018 | Lovicott | G06F 1/206 |
| 2019/0377393 A1* | 12/2019 | Uchino | G06F 1/3206 |
| 2021/0397239 A1* | 12/2021 | Sethi | G06F 1/3206 |
| 2022/0155833 A1* | 5/2022 | Watanabe | G06F 1/1616 |
| 2023/0135691 A1* | 5/2023 | Rohrkemper | H05K 7/20136 700/300 |
| 2023/0195188 A1* | 6/2023 | Chien | G06F 1/3243 710/244 |
| 2024/0061481 A1* | 2/2024 | Watanabe | G05B 19/042 |

* cited by examiner

*Primary Examiner* — Amir A Jalali
(74) *Attorney, Agent, or Firm* — Jackson Walker L.L.P.

(57) ABSTRACT

An information handling system may include a plurality of information handling resources, a plurality of air movers configured to drive air to cool the plurality of information handling resources, and a thermal control system for controlling the air movers and configured to, in response to a failure of a particular air mover of the plurality of air movers apply power capping to information handling resources assigned to an air mover zone associated with the particular air mover and apply air mover speed limits to one or more of the plurality of air movers other than the particular air mover, the air mover speed limits based on an identity of the particular air mover.

12 Claims, 4 Drawing Sheets

THERMAL OPTIMIZED CONTROL IN RESPONSE TO AIR MOVER FAILURE

TECHNICAL FIELD

The present disclosure relates in general to information handling systems, and more particularly to optimizing thermal control in an information handling system in response to failure of an air mover.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Being electromechanical components, all air movers are subject to failure for any number of reasons. Due to the possibility of air mover failure, a common requirement in information handling systems is that thermal requirements can be met even in the event of a failure of a single air mover from a plurality of air movers. Oftentimes, meeting such requirement is challenging as the failed air mover no longer provides air flow, plus may contribute to recirculation of warmer air due to air flow through the failed air mover in a direction opposite of its normal air flow.

SUMMARY

In accordance with the teachings of the present disclosure, the disadvantages and problems associated with optimizing thermal control in an information handling system may be substantially reduced or eliminated.

In accordance with embodiments of the present disclosure, an information handling system may include a plurality of information handling resources, a plurality of air movers configured to drive air to cool the plurality of information handling resources, and a thermal control system for controlling the air movers and configured to, in response to a failure of a particular air mover of the plurality of air movers apply power capping to information handling resources assigned to an air mover zone associated with the particular air mover and apply air mover speed limits to one or more of the plurality of air movers other than the particular air mover, the air mover speed limits based on an identity of the particular air mover.

In accordance with these and other embodiments of the present disclosure, a method may include, in response to a failure of a particular air mover of a plurality of air movers configured to drive air to cool a plurality of information handling resources, applying power capping to information handling resources assigned to an air mover zone associated with the particular air mover and applying air mover speed limits to one or more of the plurality of air movers other than the particular air mover, the air mover speed limits based on an identity of the particular air mover.

In accordance with these and other embodiments of the present disclosure, an article of manufacture may include a non-transitory computer-readable medium and computer-executable instructions carried on the computer-readable medium, the instructions readable by a processing device, the instructions, when read and executed, for causing the processing device to, in response to a failure of a particular air mover of a plurality of air movers configured to drive air to cool a plurality of information handling resources, apply power capping to information handling resources assigned to an air mover zone associated with the particular air mover and apply air mover speed limits to one or more of the plurality of air movers other than the particular air mover, the air mover speed limits based on an identity of the particular air mover.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages, electro-mechanical devices (e.g., air movers), displays, and power supplies.

Figure 1:
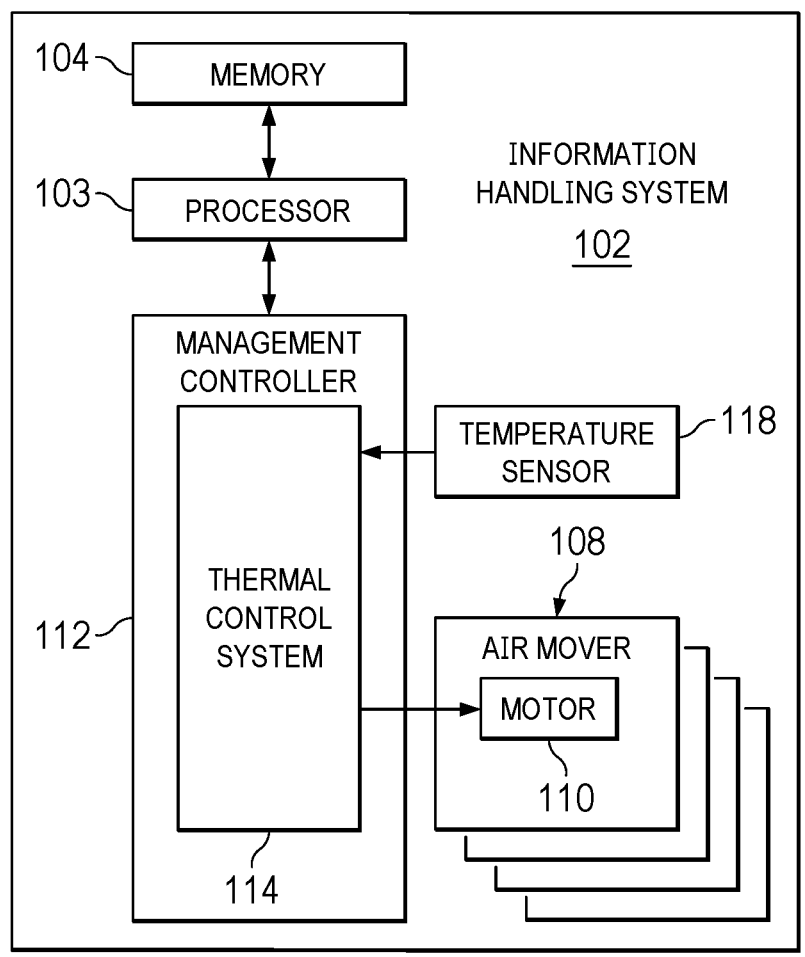
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104, a plurality of air movers 108, a management controller 112, and a temperature sensor 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

An air mover 108 may include any mechanical or electro-mechanical system, apparatus, or device operable to move air and/or other gases in order to cool information handling resources of information handling system 102. In some embodiments, an air mover 108 may comprise a fan (e.g., a rotating arrangement of vanes or blades which act on the air). In other embodiments, an air mover 108 may comprise a blower (e.g., a centrifugal fan that employs rotating impellers to accelerate air received at its intake and change the direction of the airflow). In these and other embodiments, rotating and other moving components of an air mover 108 may be driven by a motor 110. The rotational speed of motor 110 may be controlled by an air mover control signal (e.g., a pulse-width modulation signal) communicated from thermal control system 114 of management controller 112. In operation, an air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 118), and based on such one or more signals, calculate an air mover driving signal (e.g., a pulse-width modulation signal) to maintain an appropriate level of cooling, increase cooling, or decrease cooling, as appropriate, and communicate such air mover driving signal to air movers 108. Thermal control for air movers 108 by thermal control system 114 may be performed in any suitable manner, for example, as described in U.S. Pat. No. 10,146, 190 entitled "Systems and Methods for Providing Controller Response Stability in a Closed-Loop System."

In addition, thermal control system 114 may also be configured to maintain acoustic limits and/or maintain acoustic preferences for sound generated by air movers 108, for example, as described in U.S. patent application Ser. No. 16/852,118, filed Apr. 17, 2020, and entitled "Systems and Methods for Acoustic Limits of Thermal Control System in an Information Handling System," which is incorporated by reference herein in its entirety.

In some embodiments, thermal control system 114 may include a program of instructions (e.g., software, firmware) configured to, when executed by a processor or controller integral to management controller 112, carry out the functionality of thermal control system 114.

Temperature sensor 118 may comprise any system, device, or apparatus (e.g., a thermometer, thermistor, etc.) configured to communicate a signal to thermal control system 114 indicative of a temperature within information handling system 102.

Figure 2:
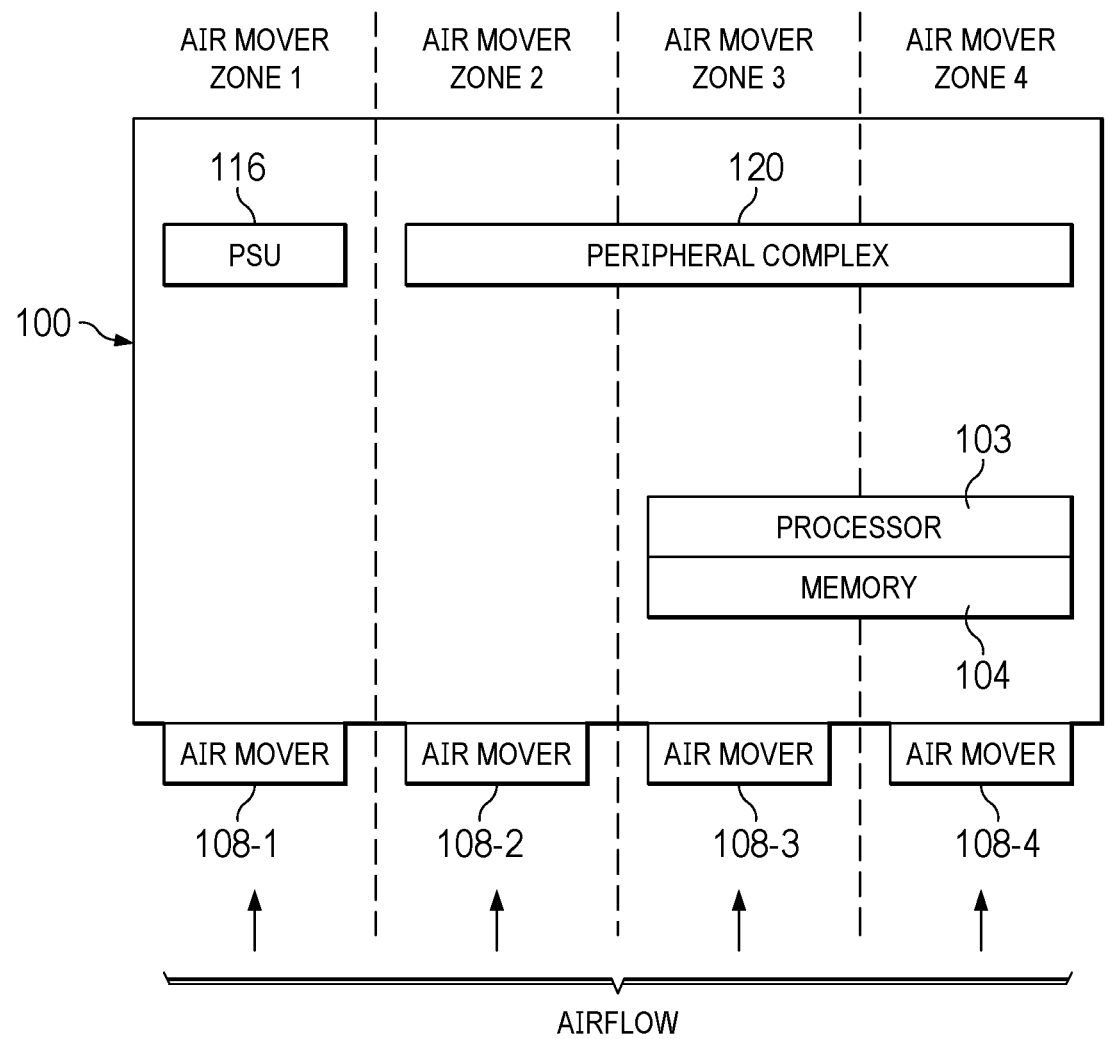
FIG. 2 illustrates a plan view of selected components of an information handling system, in accordance with embodiments of the present disclosure.

In addition to processor 103, memory 104, air mover 108, management controller 112, and temperature sensor 118, information handling system 102 may include one or more other information handling resources. In addition, for the sake of clarity and exposition of the present disclosure, FIG. 1 depicts four air movers 108 and one temperature sensor 118. In embodiments of the present disclosure, information handling system 102 may include any number of air movers 108 and any number of temperature sensors 118. FIG. 2 illustrates a plan view of selected components of an information handling system 102, in accordance with embodiments of the present disclosure. In particular, FIG. 2 provides an example of physical configuration of components within information handling system 102. However, it is understood that components of information handling system 102 may be arranged in any suitable configuration.

In the example of FIG. 2, information handling system 102 is shown having four air movers 108 (e.g., air mover 108-1, air mover 108-2, air mover 108-3, and air mover 108-4) arranged at an edge of a chassis 100 for enclosing the components of information handling system 102, such that air movers 108 may, when operational, draw in ambient air from the exterior of chassis 100, and drive such air proximate to components of information handling system 102 in order to cool such components. While other components may be present in information handling system 102, for purposes of clarity and exposition, in the example configuration of FIG. 2, information handling system 102 may include a power supply unit (PSU) 116 downstream of the airflow driven by air mover 108-1, a peripheral complex 120 downstream of the airflow driven by airflow driven by air movers 108-2, 108-3, and 108-4, and a core comprising processor 103 and memory 104 downstream of the airflow driven by airflow driven by air movers 108-3 and 108-4 and located between peripheral complex 120 and air movers 108-3 and 108-4.

From the standpoint of thermal control system 114 and management controller 112, critical components of information handling system 102 may be logically assigned to one or more air mover zones based on which air mover(s) 108 drive airflow to such components. For example, in the example configuration of FIG. 2, air mover zone 1 may include components downstream of airflow driven by air mover 108-1, air mover zone 2 may include components downstream of airflow driven by air mover 108-2, air mover zone 3 may include components downstream of airflow driven by air mover 108-3, and air mover zone 4 may include components downstream of airflow driven by air mover 108-4. Thus, in the example configuration of FIG. 2, PSU 116 may be assigned to air mover zone 1, peripheral complex 120 may be assigned to air mover zones 2, 3, and 4, and processor 103 and memory 104 may be assigned to air mover zones 3 and 4.

Figure 3:
FIG. 3 illustrates an example table for thermal optimization in response to air mover failure, in accordance with embodiments of the present disclosure.

FIG. 3 illustrates an example table 300 for thermal optimization in response to air mover failure, in accordance with embodiments of the present disclosure. Table 300 may include a plurality of entries, each entry indexed by a particular air mover 108 or zone associated with such particular air mover 108, and each entry defining a power capping value for components of the zone associated with the particular air mover 108, and further defining air mover speed limits to be applied to air movers other than the particular air mover 108 in the event of failure of the particular air mover 108. The power capping value for each air mover zone in the event of air mover failure for such air mover zone may be based on thermal requirements of components within such air mover zone and/or a priority of such components relative to components outside of such air mover zone. For example, it may be acceptable to power cap PSU 116 lower than peripheral complex 120, processor 103, and memory 104, and it may also be acceptable to power cap peripheral complex 120 lower than processor 103 and memory 104.

In addition, the air mover speed limits may be defined based on the premise that components in certain air mover zones may be more critical as compared to components outside of such zones, and thus air mover speed limits may be set lower for air movers 108 driving less-critical components.

In the particular example of table 300, in the event of a failure of air mover 108-1, components in air mover zone 1 may be capped at drawing 10% of the maximum power draw for such components. Further, in the event of a failure of air mover 108-1, air mover 108-2 may have a speed limit of 80% of its maximum speed, air mover 108-3 may have a speed limit of 100% of its maximum speed, and air mover 108-4 may have a speed limit of 100% of its maximum speed.

Further, as set forth in table 300, in the event of a failure of air mover 108-2, components in air mover zone 2 (e.g., peripheral complex 120) may be capped at drawing 30% of the maximum power draw for such components. Further, in the event of a failure of air mover 108-2, air mover 108-1 may have a speed limit of 80% of its maximum speed, air mover 108-3 may have a speed limit of 100% of its maximum speed, and air mover 108-4 may have a speed limit of 100% of its maximum speed.

In addition, as set forth in table 300, in the event of a failure of air mover 108-3, components in air mover zone 3 (e.g., peripheral complex 120, processor 103, memory 104) may be capped at drawing 50% of the maximum power draw for such components. Further, in the event of a failure of air mover 108-3, air mover 108-1 may have a speed limit of 50% of its maximum speed, air mover 108-2 may have a speed limit of 50% of its maximum speed, and air mover 108-4 may have a speed limit of 100% of its maximum speed.

Also, as set forth in table 300, in the event of a failure of air mover 108-4, components in air mover zone 4 (e.g., peripheral complex 120, processor 103, memory 104) may be capped at drawing 50% of the maximum power draw for such components. Further, in the event of a failure of air mover 108-4, air mover 108-1 may have a speed limit of 50% of its maximum speed, air mover 108-2 may have a speed limit of 50% of its maximum speed, and air mover 108-3 may have a speed limit of 100% of its maximum speed.

Table 300 is an example of a data structure that may be used by management controller 112 to perform thermal optimized control in the event of air mover failure. In some embodiments, other suitable data structures may be used, including without limitation a list, map, database, or other data structure.

Figure 4:
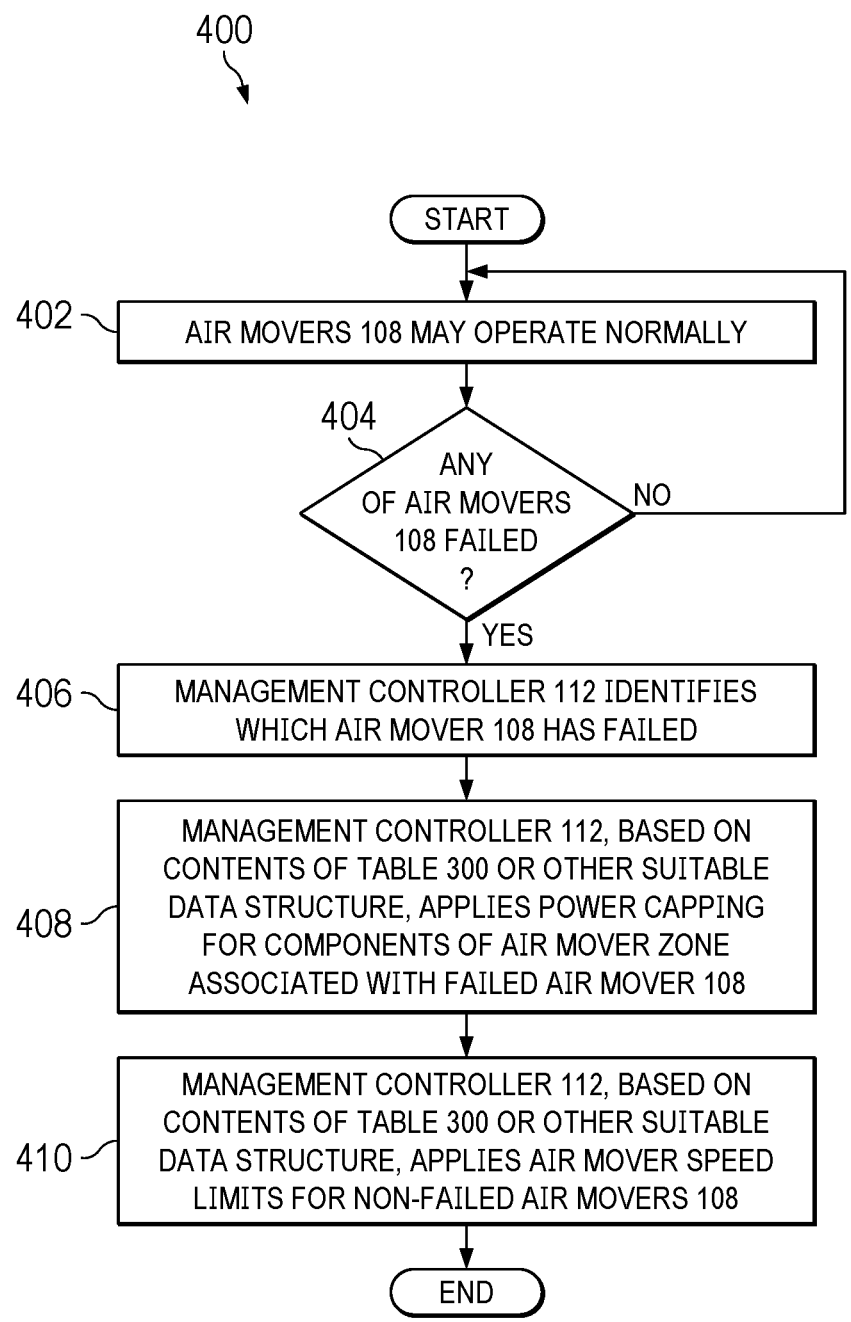
FIG. 4 illustrates a flow chart of an example method for thermal optimization in response to air mover failure, in accordance with embodiments of the present disclosure.

FIG. 4 illustrates a flow chart of an example method 400 for thermal optimization in response to air mover failure, in accordance with embodiments of the present disclosure. According to one embodiment, method 400 may begin at step 402. As noted above, teachings of the present disclosure may be implemented in a variety of configurations of information handling system 102 and/or thermal control system 114. As such, the preferred initialization point for method 400 and the order of the steps comprising method 400 may depend on the implementation chosen.

At step 402, absent of failures of air movers 108, air movers 108 may operate normally, with no air mover speed limits applied, and without any power capping applied to any of the air mover zones. At step 404, management controller 112 may determine if any of air movers 108 has failed. If an air mover has failed, method 400 may proceed to step 406. Otherwise, method 400 may return to step 402.

At step 406, management controller 112 may determine which air mover 108 has failed. At step 408, management controller 112 may, based on contents of table 300 or another suitable data structure, apply power capping for components of the air mover zone associated with the failed air mover 108. At step 410, management controller 112 may also, based on contents of table 300 or another suitable data structure, apply air mover speed limits for non-failed air movers 108.

After completion of step 410, method 400 may end.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 200, the steps comprising method 200 may be completed in any suitable order.

Method 400 may be implemented using information handling system 102, thermal control system 114, or any other system operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
a plurality of information handling resources;
a plurality of air movers configured to drive air to cool the plurality of information handling resources; and
a thermal control system for controlling the air movers and configured to, in response to a failure of a particular air mover of the plurality of air movers:

apply power capping to information handling resources assigned to an air mover zone associated with the particular air mover; and apply air mover speed limits to one or more of the plurality of air movers other than the particular air mover, the air mover speed limits based on an identity of the particular air mover.

2. The information handling system of claim 1, wherein applying power capping to the information handling resources assigned to the air mover zone associated with the particular air mover comprises applying power capping to each of the information handling resources as a percentage of a maximum power consumption of each of the information handling resources.

3. The information handling system of claim 1, wherein each of the air mover speed limits is defined by a percentage of a maximum speed of the air mover to which the air mover speed limit is applied.

4. The information handling system of claim 1, wherein the power capping and the air mover speed limits are set forth in an entry of a data structure wherein the entry is indexed by an identity of the particular air mover.

5. A method comprising, in response to a failure of a particular air mover of a plurality of air movers configured to drive air to cool a plurality of information handling resources:

applying power capping to information handling resources assigned to an air mover zone associated with the particular air mover; and applying air mover speed limits to one or more of the plurality of air movers other than the particular air mover, the air mover speed limits based on an identity of the particular air mover.

6. The method of claim 5, wherein applying power capping to the information handling resources assigned to the air mover zone associated with the particular air mover comprises applying power capping to each of the information handling resources as a percentage of a maximum power consumption of each of the information handling resources.

7. The method of claim 5, wherein each of the air mover speed limits is defined by a percentage of a maximum speed of the air mover to which the air mover speed limit is applied.

8. The method of claim 5, wherein the power capping and the air mover speed limits are set forth in an entry of a data structure wherein the entry is indexed by an identity of the particular air mover.

9. An article of manufacture comprising:

a non-transitory computer-readable medium; and computer-executable instructions carried on the computer-readable medium, the instructions readable by a processing device, the instructions, when read and executed, for causing the processing device to, in response to a failure of a particular air mover of a plurality of air movers configured to drive air to cool a plurality of information handling resources:

apply power capping to information handling resources assigned to an air mover zone associated with the particular air mover; and apply air mover speed limits to one or more of the plurality of air movers other than the particular air mover, the air mover speed limits based on an identity of the particular air mover.

10. The article of claim 9, wherein applying power capping to the information handling resources assigned to the air mover zone associated with the particular air mover comprises applying power capping to each of the information handling resources as a percentage of a maximum power consumption of each of the information handling resources.

11. The article of claim 9, wherein each of the air mover speed limits is defined by a percentage of a maximum speed of the air mover to which the air mover speed limit is applied.

12. The article of claim 9, wherein the power capping and the air mover speed limits are set forth in an entry of a data structure wherein the entry is indexed by an identity of the particular air mover.

* * * * *